(12) United States Patent
Kimura et al.

(10) Patent No.: US 8,524,838 B2
(45) Date of Patent: Sep. 3, 2013

(54) HEAT-CURABLE URETHANE RESIN COMPOSITION

(75) Inventors: Kazuya Kimura, Kanagawa (JP); Hiroshi Uchida, Kanagawa (JP)

(73) Assignee: Showa Denko K.K., Tokyo (JP)

(*) Notice: Subject to any disclaimer, the term of this patent is extended or adjusted under 35 U.S.C. 154(b) by 613 days.

(21) Appl. No.: 11/663,192

(22) PCT Filed: Sep. 20, 2005

(86) PCT No.: PCT/JP2005/017659
§ 371 (c)(1),
(2), (4) Date: Mar. 19, 2007

(87) PCT Pub. No.: WO2006/033439
PCT Pub. Date: Mar. 30, 2006

(65) Prior Publication Data
US 2007/0293636 A1    Dec. 20, 2007

Related U.S. Application Data

(60) Provisional application No. 60/613,235, filed on Sep. 28, 2004, provisional application No. 60/615,966, filed on Oct. 6, 2004.

(30) Foreign Application Priority Data

Sep. 21, 2004   (JP) .................................. 2004-273553
Sep. 30, 2004   (JP) .................................. 2004-286192

(51) Int. Cl.
*C08L 69/00*    (2006.01)
*C08L 75/06*    (2006.01)
*C08F 283/02*   (2006.01)

(52) U.S. Cl.
USPC ........................... 525/408; 525/454; 525/453

(58) Field of Classification Search
USPC ........................................................ 525/453
See application file for complete search history.

(56) References Cited

U.S. PATENT DOCUMENTS

| | | | |
|---|---|---|---|
| 4,103,070 A | 7/1978 | Ammons | |
| 4,755,337 A | 7/1988 | Takahashi et al. | |
| 4,764,430 A * | 8/1988 | Blackburn et al. | 428/413 |
| 5,045,622 A * | 9/1991 | Kohno et al. | 528/48 |
| 5,334,651 A * | 8/1994 | Schwab et al. | 524/591 |
| 5,340,946 A * | 8/1994 | Friedrich et al. | 174/256 |
| 5,357,008 A * | 10/1994 | Tsai et al. | 525/526 |
| 5,464,494 A | 11/1995 | Bolte et al. | |
| 5,786,070 A * | 7/1998 | Higuchi et al. | 428/220 |
| 6,509,409 B1 * | 1/2003 | Thetford | 524/589 |
| 6,610,779 B1 | 8/2003 | Blum et al. | |
| 6,747,088 B1 | 6/2004 | Schwalm et al. | |
| 6,818,382 B2 * | 11/2004 | Tamura et al. | 430/281.1 |
| 7,741,411 B2 * | 6/2010 | Uchida et al. | 525/454 |
| 7,935,752 B2 * | 5/2011 | Uchida et al. | 524/133 |
| 7,951,868 B2 * | 5/2011 | Uchida et al. | 524/590 |
| 2004/0002561 A1 * | 1/2004 | Saeki et al. | 524/284 |
| 2004/0170832 A1 * | 9/2004 | Andre et al. | 428/375 |
| 2009/0171015 A1 * | 7/2009 | Uchida et al. | 524/590 |

FOREIGN PATENT DOCUMENTS

| | | |
|---|---|---|
| EP | 1 170 315 A1 | 1/2002 |
| EP | 1170315 A1 * | 1/2002 |
| JP | 52132096 | 11/1977 |
| JP | 02160820 | 6/1990 |
| JP | 5-75032 B2 | 10/1993 |
| JP | 10279652 | 10/1998 |
| JP | 11-158252 A | 6/1999 |
| JP | 11335595 | 12/1999 |
| JP | 2002156754 | 5/2002 |
| JP | 2002537454 | 11/2002 |
| JP | 2004016325 | 1/2004 |
| JP | 2004019016 | 1/2004 |
| JP | 2004062057 | 2/2004 |
| JP | 2005331932 | 12/2005 |
| WO | WO 03/048235 * | 6/2003 |

OTHER PUBLICATIONS

Saunders, K.J. Organic Polymer Chemistry, 2nd ed. p. 417. Chapman and Hall, Ltd.: New York, NY. 1988.*
Japanese Office Action dated Jan. 5, 2011.
Japanese Office Action dated Dec. 14, 2010.

* cited by examiner

*Primary Examiner* — Mike M Dollinger
(74) *Attorney, Agent, or Firm* — Sughrue Mion, PLLC

(57) ABSTRACT

The invention provides a heat-curable resin composition comprising (A) a polyurethane having two or more carboxyl groups in one molecule, in particular a polyurethane having one or more carboxyl groups at a molecular terminal and (B) a heat-curable component, a cured product thereof, a solder resist and a protective film consisting of the cured product and a printed wiring board coated with the cured product. The polyurethane (A), preferably has a number average molecular weight of 500 to 100,000 and an acid value of 5 to 150 mgKOH/g. The heat-curable component (B) is preferably an epoxy resin. The heat-curable resin composition of the invention is excellent in adhesion with a substrate, low-warpage property, flexibility, resistance to moisture and heat, soldering heat resistance and resistance to tin plating.

11 Claims, No Drawings

HEAT-CURABLE URETHANE RESIN COMPOSITION

CROSS-REFERENCE TO RELATED APPLICATIONS

This is an application filed pursuant to 35 U.S.C. Section 111(a) with claiming the benefit of U.S. provisional application Ser. No. 60/613,235 filed Sep. 28, 2004 and U.S. provisional application Ser. No. 60/615,966 filed Oct. 6, 2004 under the provision of 35 U.S.C. 111(b), pursuant to 35 U.S.C. Section 119(e)(1).

TECHNICAL FIELD

The present invention relates to a heat-curable resin composition containing a polyurethane having two or more carboxyl groups in one molecule, in particular a polyurethane having one or more carboxyl groups at the molecular terminal and a heat-curable component. More specifically, the present invention relates to a heat-curable resin composition excellent in adhesion with a substrate, low-warpage property, flexibility, resistance to moisture and heat, soldering heat resistance and resistance to tin plating. The heat-curable resin composition of the present invention can be effectively used in the fields of protective film or electrical insulating material such as a solder resist or an interlayer insulator; a sealing material for an IC or a very large scale integrated circuit (VLSI); a laminate sheet; and the like.

BACKGROUND ART

Heat-curable resins, which are being widely used as leading-edge high-performance material and the like, are employed as polymer materials excellent in heat resistance, environmental stability, dynamic properties and electrical properties in applications such as protective film or electrical insulating material such as a solder resist or an interlayer insulator; a sealing material for an IC or a very large scale integrated circuit; and a laminate sheet.

However, when used for a solder resist, there is a problem of warpage caused by large shrinkages occurring during curing process and during cooling process after the curing of the heat-curable resin.

An example of a conventional heat-curable resist includes such an epoxy resin-based resist composition containing an epoxy resin and a dibasic acid anhydride as essential ingredients as disclosed in JP-B-05-75032. However, the conventional heat-curable resist involves a problem in that resistance to moisture and heat, soldering heat resistance and in particular, resistance to tin plating are deteriorated, for example in a case where the resist is formed into a coating film imparted with low-warpage property and flexibility.

JP-A-11-158252 discloses a composition for forming a flexible protective film with low-warpage property. The composition contains a polyfunctional epoxy resin and a specific polyacrylic resin as essential ingredients. Therefore, in order to balance these components with properties competing against them (such as plating resistance) in the composition, the polyacrylic resin must be regulated in terms of both an acid value and a glass transition temperature. In addition, plating resistance will not always be sufficient if low-warpage property is to be obtained.

DISCLOSURE OF THE INVENTION

Therefore, the main object of the present invention is to solve the above problems and provide a heat-curable resin composition excellent in adhesion with a substrate, low-warpage property, flexibility, resistance to moisture and heat, soldering heat resistance and resistance to tin plating.

The present inventors have made extensive studies to solve the above problems. As a result, the inventors have found out that a heat-curable resin composition containing (A) polyurethane having two or more carboxyl groups in one molecule, in particular a polyurethane having one or more carboxyl groups at the molecular terminal; and (B) a heat-curable component, which is well balanced in properties such as adhesion with a substrate, low-warpage property, flexibility, resistance to moisture and heat, soldering heat resistance and resistance to tin plating, can solve the above problems. Thus, the inventors have completed the present invention.

That is, the present invention relates to a heat-curable resin composition, a cured product thereof, a solder resist and a protective film composed of the cured product, and a printed wiring board coated with the cured product, described in the following items 1 to 25.

1. A heat-curable resin composition comprising (A) a polyurethane having two or more carboxyl groups in one molecule and (B) a heat-curable component.
2. The heat-curable resin composition according to the above item 1, wherein the polyurethane (A) is a polyurethane which has one or more carboxyl groups at a molecular terminal.
3. The heat-curable resin composition according to the above item 1, wherein the polyurethane (A) is a polyurethane which has two or more carboxyl groups in one molecule and a urethane bond formed through a reaction between a polymer polyol (b) and a polyisocyanate (c).
4. The heat-curable resin composition according to the above item 2 or 3, wherein the polyurethane (A) is a polyurethane which is formed through terminal sealing reaction where a monocarboxylic acid compound (a) having both a functional group reactive with an isocyanate group to cause addition reaction or condensation reaction and a carboxyl group in its molecule is used and further the polyurethane (A) is a polyurethane which has one or more carboxyl groups at a molecular terminal and has two or more carboxyl groups per one molecule.
5. The heat-curable resin composition according to the above item 1, wherein the polyurethane (A) has a number average molecular weight of 500 to 100,000 and an acid value of 5 to 150 mgKOH/g.
6. The heat-curable resin composition according to the above item 4, wherein the monocarboxylic acid compound (a) having both a functional group reactive with an isocyanate group to cause addition reaction or condensation reaction and a carboxyl group in its molecule is at least one selected from the group consisting of a monocarboxylic acid compound having a hydroxyl group, a monocarboxylic acid compound having an amino group and a monocarboxylic acid compound having a thiol group.
7. The heat-curable resin composition according to the above item 4 or 6, wherein the monocarboxylic acid compound (a) is a monohydroxycarboxylic acid.
8. The heat-curable resin composition according to the above item 3, wherein the polymer polyol (b) is at least one selected from the group consisting of a polycarbonate-based polyol, a polyether-based polyol, a polyester-based polyol, a polyolefin-based polyol, and an acrylic polyol.
9. The heat-curable resin composition according to the above item 3, wherein the polymer polyol (b) is a polycarbonate diol.

10. The heat-curable resin composition according to the above item 9, wherein the polycarbonate diol has a number average molecular weight of 200 to 5,000.
11. The heat-curable resin composition according to the above item 9 or 10, wherein the structural unit of the polycarbonate diol is at least one repeating unit selected from the group consisting of repeating units derived from one or more kinds of linear aliphatic diols, repeating units derived from one or more kinds of alicyclic diols and repeating units derived from both linear aliphatic diol and alicyclic diol.
12. The heat-curable resin composition according to the above item 11, wherein the polycarbonate diol contains as structural units, repeating units derived from a linear aliphatic diol and an alicyclic diol, the number average molecular weight of the polycarbonate diol is from 400 to 2,000 and the copolymerization ratio between the linear aliphatic diol and the alicyclic diol is from 3:7 to 7:3 in mass ratio.
13. The heat-curable resin composition according to the above item 3, wherein the polyisocyanate (c) is an alicyclic diisocyanate derived from an alicyclic diamine.
14. The heat-curable resin composition according to the above item 3, wherein the polyurethane (A) is obtained by reaction using a polyol (d) having a carboxyl group in addition to polymer polyol (b) and the polyisocyanate (c).
15. The heat-curable resin composition according to the above item 14, wherein the polyol (d) having a carboxyl group is a dihydroxy aliphatic carboxylic acid.
16. The heat-curable resin composition according to the above item 1, wherein the heat-curable component (B) is an epoxy resin.
17. The heat-curable resin composition according to the above item 16, wherein the epoxy resin is at least one selected from the group consisting of a bisphenol S-type epoxy resin, a diglycidyl phthalate resin, a heterocyclic epoxy resin, a bixylenol-type epoxy resin, a biphenyl-type epoxy resin and a tetraglycidyl xylenoyl ethane resin.
18. The heat-curable resin composition according to the above item 16 or 17, wherein the ratio of the epoxy equivalent of the epoxy resin as the heat-curable component (B) to a carboxyl group equivalent of the polyurethane (A) having one or more carboxyl groups at a molecular terminal and having two or more carboxyl groups per one molecule is 1.0 to 3.0.
19. The heat-curable resin composition according to the above item 1, further comprising a curing agent.
20. The heat-curable resin composition according to the above item 19, wherein the curing agent is at least one selected from the group consisting of an amine, a quaternary ammonium salt, an acid anhydride, a polyamide, a nitrogen-containing heterocyclic compound and an organometallic compound.
21. The heat-curable resin composition according to the above item 1, further containing an organic solvent.
22. A cured product obtained by curing the heat-curable resin composition according to any one of the above items 1 to 21.
23. A solder resist formed of the cured product according to the above item 22.
24. A protective film formed of the cured product according to the above item 22.
25. A printed wiring board having a surface partly or entirely coated with the cured product according to the above item 22.

The heat-curable resin composition containing the polyurethane (A) having a urethane bond and the heat-curable component (B) according to the present invention is excellent in adhesion with a substrate, low-warpage property, flexibility, resistance to moisture and heat, soldering heat resistance and resistance to tin plating. The heat-curable resin composition can be suitably used for applications in the fields of: a protective film or an electrical insulating material such as a solder resist or an interlayer insulator; a sealing material for an IC or a very large scale integrated circuit (VLSI); a laminate sheet; and the like. In conventional solder resists, warpage due to large shrinkages occurring during curing process and during cooling process after the curing causes reduction in yield. However, the heat-curable resin composition according to the present invention achieves a balance between low-warpage property or flexibility and properties of soldering heat resistance, resistance to moisture and heat and plating resistance, which have been conventionally incompatible with each other. The heat-curable resin composition comprising (A) polyurethane having one or more carboxyl groups at the molecular terminal and having two or more carboxyl groups per one molecule and (B) a heat-curable component of the present invention enables formation of a solder resist or protective film particularly excellent in resistance to tin plating at low cost and with high productivity.

BEST MODE FOR CARRYING OUT THE INVENTION

Hereinafter, the present invention will be described in detail.

The polyurethane (A) has two or more carboxyl groups per one molecule. Further, the polyurethane (A) has a urethane bond formed through a reaction between a polymer polyol (b) and a polyisocyanate (c). The polyurethane (A) is obtained by, for example, terminal sealing reaction by means of a monocarboxylic acid compound (a) having both a functional group reactive with an isocyanate group to cause an addition reaction or a condensation reaction and a carboxyl group in its molecule, and the polyurethane (A) is a polyurethane which has one or more carboxyl groups at its molecular terminal and has two or more carboxyl groups per one molecule. As a terminal sealing agent, monocarboxylic acid compound (a) is allowed to react. However, for the purpose of adjusting an acid value, a polyol (d) having a carboxyl group may be added to the polymer polyol (b) and the polyisocyanate (c).

The monocarboxylic acid compound (a) is used for the purpose of allowing a carboxyl group to be present at a terminal of the polyurethane (A), serves as a terminal sealing agent for the polyurethane (A), and has only to be a monocarboxylic acid compound having, in a molecule, both a functional group reactive with isocyanate and a carboxyl group. Examples of the monocarboxylic acid compound (a) include monocarboxylic acids each having a functional group such as a hydroxyl group, an amino group, or a thiol group which can react with an isocyanate group to cause an addition reaction or a condensation reaction, i.e., a monohydroxycarboxylic acid (a1), a monocarboxylic acid (a2) having an amino group, and a monocarboxylic acid (a3) having a thiol group. Specific examples of the monohydroxycarboxylic acid (a1) include glycolic acid, lactic acid, hydroxypivalic acid, malic acid and citric acid. Specific examples of the monocarboxylic acid (a2) having an amino group include glycin. Specific examples of the monocarboxylic acid (a3) having a thiol group include thioglycolic acid.

The use of the monocarboxylic acid (a) having, in a molecule, both a functional group which can react with an isocyanate group and a carboxyl group allows a carboxyl group to be present at a molecular terminal of the polyurethane (A). As a result, there can be obtained a heat-curable resin composition which is excellent in adhesion with a substrate, low-warpage property, and flexibility, is excellent in a balance among resistance to moisture and heat, soldering heat resistance and plating resistance, and is particularly excellent in resistance to tin plating.

Examples of the polymer polyol (b) include a polycarbonate-based polyol, a polyether-based polyol, a polyester-based polyol, a polyolefin-based polyol, and an acrylic polyol. A polycarbonate-based polyol, especially a polycarbonate diol is preferable. Examples of the polycarbonate diol include a polycarbonate diol (b1) containing, as a structural unit, one or more kinds of linear aliphatic diol-derived repeating unit, a polycarbonate diol (b2) containing, as a structural unit, one or more kinds of alicyclic diol-derived repeating unit and a polycarbonate diol (b3) containing, as structural units, repeating units derived from both a linear aliphatic diol and an alicyclic diol.

Examples of the polycarbonate diol (b1) containing, as a structural unit, a linear aliphatic diol-derived repeating unit include a polycarbonate diol derived from 1,6-hexanediol, a polycarbonate diol derived from 1,5-pentanediol and 1,6-hexanediol, a polycarbonate diol derived from 1,4-butanediol and 1,6-hexanediol, and a polycarbonate diol derived from 3-methyl-1,5-pentanediol and 1,6-hexanediol.

Examples of the polycarbonate diol (b2) containing, as a structural unit, an alicyclic diol-derived repeating unit include a polycarbonate diol derived from 1,4-cyclohexanedimethanol.

Examples of the polycarbonate diol (b3) containing, as structural units, repeating units derived from both a linear aliphatic diol and an alicyclic diol include a polycarbonate diol derived from 1,6-hexanediol and 1,4-cyclohexanedimethanol.

A polycarbonate diol containing, as a structural unit, a linear aliphatic diol-derived repeating unit tends to be excellent in low-warpage property and flexibility while a polycarbonate diol containing, as a structural unit, an alicyclic diol-derived repeating unit tends to have high crystallinity to be excellent in resistance to tin plating and soldering heat resistance. In view of the above, two or more kinds of those polycarbonate diols may be used in combination, or a polycarbonate diol containing, as structural units, repeating units derived from both a linear aliphatic diol and an alicyclic diol may be used. A polycarbonate diol having a copolymerization ratio between a linear aliphatic diol and an alicyclic diol of 3:7 to 7:3 in mass ratio is suitably used for expressing low-warpage property, flexibility, soldering heat resistance, and resistance to tin plating in a balanced manner.

A polycarbonate diol having a number average molecular weight of 200 to 5,000 is preferable. In the above-described case where a polycarbonate diol contains, as structural units, repeating units derived from a linear aliphatic diol and an alicyclic diol, and has a copolymerization ratio between the linear aliphatic diol and the alicyclic diol of 3:7 to 7:3 in mass ratio, the polycarbonate diol preferably has a number average molecular weight of 400 to 2,000.

Examples of the polyisocyanate (c) include diisocyanates such as 2,4-toluene diisocyanate, 2,6-toluene diisocyanate, isophorone diisocyanate, hexamethylene diisocyanate, diphenylmethylene diisocyanate, (o, m, or p)-xylene diisocyanate, hydrogenated (o, m, or p)-xylene diisocyanate; methylenebis(cyclohexylisocyanate), trimethylhexamethylene diisocyanate, cyclohexane-1,3-dimethylene diisocyanate, cyclohexane-1,4-dimethylene diisocyanate and 1,5-naphthalene diisocyanate. Each of those polyisocyanates may be used alone, or two or more of them may be used in combination. Of those, an alicyclic diisocyanate derived from an alicyclic diamine, to be specific, isophorone diisocyanate or hydrogenated (o, m, or p)-xylene diisocyanate is preferable. By use of any one of those diisocyanates, a cured product excellent in resistance to tin plating can be obtained.

A dihydroxy aliphatic carboxylic acid having a carboxyl group is particularly preferably used as the polyol (d) having a carboxyl group. Examples of such dihydroxyl compound include dimethylolpropionic acid and dimethylolbutanoic acid. The use of a dihydroxy aliphatic carboxylic acid having a carboxyl group easily allows a carboxyl group to be present in a urethane resin.

The monohydroxy compound has only to be a compound having one hydroxy group in a molecule to serve as a terminal sealing agent for the polyurethane (A). Examples of the monohydroxy compound include aliphatic alcohol and monohydroxymono(meth)acrylate compound. Examples of aliphatic alcohol include methanol, ethanol, propanol and isobutanol, and examples of monohydroxymono(meth)acrylate compound include 2-hydroxyethylacrylate.

The urethane resin (A) has a number average molecular weight of preferably 500 to 100,000, more preferably 8,000 to 30,000. The term "number average molecular weight" as used herein refers to a value in terms of polystyrene measured by means of gel permeation chromatography. A number average molecular weight of the urethane resin (A) of less than 500 may impair the elongation percentage, flexibility, and strength of a cured film, while a number average molecular weight in excess of 100,000 may harden the urethane resin (A) to reduce its flexibility.

It is preferable that the acid value of the urethane resin (A) be from 5 to 150 mgKOH/g, more preferably 30 to 120 mgKOH/g. An acid value of less than 5 mgKOH/g may reduce reactivity with a curable component to impair heat resistance. An acid value in excess of 150 mgKOH/g may reduce properties of a cured film as a resist such as alkali resistance and electrical properties. The acid value of the resin is measured in conformity with JIS K5407.

An epoxy resin that reacts with the polyurethane (A) is used as the heat-curable component (B). Examples of the epoxy resin include epoxy compounds each having two or more epoxy groups in one molecule, such as a bisphenol A-type epoxy resin, a hydrogenated bisphenol A-type epoxy resin, a brominated bisphenol A-type epoxy resin, a bisphenol F-type epoxy resin, a novolac-type epoxy resin, a phenol novolac-type epoxy resin, a cresol novolac-type epoxy resin, an N-glycidyl-type epoxy resin, a bisphenol A novolac-type epoxy resin, a chelate-type epoxy resin, a glyoxal-type epoxy resin, an amino group-containing epoxy resin, a rubber-modified epoxy resin, a dicyclopentadiene phenolic epoxy resin, a silicone-modified epoxy resin, and an ε-caprolactone-modified resin. An epoxy compound having a halogen atom such as a chlorine atom or bromine atom, a phosphorus atom, or the like introduced into its structure for imparting flame retardancy may also be used. A bisphenol S-type epoxy resin, a diglycidyl phthalate resin, a heterocyclic epoxy resin, a bixylenol-type epoxy resin, a biphenol-type epoxy resin, a tetraglycidyl xylenoyl ethane resin and the like may also be used.

In the heat-curable resin composition of the present invention, the heat-curable component (B) is used in the form of a single compound or a mixture of two or more kinds of compounds. The amount of the heat-curable component (B) is desirably such that a ratio of an epoxy equivalent of the epoxy resin as the heat-curable component (B) to a carboxyl group equivalent of the polyurethane (A) having a carboxyl group is from 1.0 to 3.0. With a ratio of less than 1.0, electrical insulating property of cured film made of the heat-curable resin composition becomes insufficient, while a ratio in excess of 3.0 tends to increase shrinkage of a cured film, resulting in deterioration in low-warpage property required when the heat-curable resin composition is used for an insulating protective film for a flexible printed wiring board (FPC).

A curing agent to be used in the present invention intends to promote a heat-curable reaction, and is used for additionally improving properties such as adhesion, chemical resistance and heat resistance. Examples of such curing agent include conventionally used and known curing agents or curing accelerators such as imidazole derivatives (e.g. 2MZ, 2E4MZ, $C_{11}Z$, $C_{17}Z$, 2PZ, 1B2MZ, 2MZ-CN, 2E4MZ-CN, $C_{11}Z$-CN, 2PZ-CN, 2PHZ-CN, 2MZ-CNS, 2E4MZ-CNS, 2PZ-CNS, 2MZ-AZINE, 2E4MZ-AZINE, $C_{11}Z$-AZINE, 2MA-OK, 2P4MHZ, 2PHZ, and 2P4BHZ manufactured by Shikoku Corp.); guanamines such as acetoguanamine and benzoguanamine; polyamines such as diaminodiphenylmethane, m-phenylenediamine, m-xylenediamine, diaminodiphenylsulfone, dicyandiamide, urea, urea derivative, melamine, and polybasic hydrazide; organic acid salts and/or epoxy adducts of them; amine complex of boron trifluoride; triazine derivatives such as ethyldiamino-S-triazine, 2,4-diamino-S-triazine and 2,4-diamino-6-xylyl-S-triazine; amines such as trimethylamine, triethanolamine, N,N-dimethyloctylamine, N-benzyldimethylamine, pyridine, N-methylmorpholine, hexa(N-methyl)melamine, 2,4,6-tris(dimethylaminophenol), tetramethylguanidine and m-aminophenol; polyphenols such as polyvinyl phenol, a brominated product of polyvinyl phenol, phenol novolac and alkyl phenol novolac; organic phosphines such as tributylphosphine, triphenylphosphine and tris-2-cyanoethylphosphine; phosphonium salts such as tri-n-butyl(2,5-dihydroxyphenyl)phosphonium bromide and hexadecyl tributylphosphonium chloride; quaternary ammonium salts such as benzyl trimethylammonium chloride and phenyl tributylammonium chloride; polybasic acid anhydrides; photocationic polymerization catalysts such as diphenyl iodonium tetrafluoroborate, triphenyl sulfonium hexafluoroantimonate, 2,4,6-triphenyl thiopyrylium hexafluorophosphate, IRGACURE 261 manufactured by Ciba Geigy, and Optomer SP-170 manufactured by Asahi Denka Co., Ltd.; a styrene-maleic anhydride resin; an equimolar reaction product of phenyl isocyanate and dimethylamine; and an equimolar reaction product of an organic polyisocyanate such as tolylene diisocyanate or isophorone diisocyanate and dimethylamine.

Each of those curing agents may be used alone, or two more of them may be used as a mixture. A curing agent, although it is not always indispensable to use it, may be used in an amount of 25 parts by mass or less with respect to 100 parts by mass of the heat-curable component (B) in order to significantly promote curing. An amount in excess of 25 parts by mass is not preferable because the amount of a sublimation component from a cured product of the heat-curable component increases.

The heat-curable resin composition of the present invention is obtained by dissolving or dispersing the polyurethane (A) and the heat-curable component (B) by means of a mixer such as a disperser, a kneader, a three-roll mill or a bead mill. At that time, a solvent inactive against an epoxy group and a carboxyl group may be used. A preferred example of such a solvent is organic solvent.

An organic solvent is used for easily dissolving or dispersing the polyurethane (A) and the heat-curable component (B) or for obtaining a viscosity suitable for coating. Examples of the organic solvent include toluene, xylene, ethylbenzene, nitrobenzene, cyclohexane, isophorone, diethylene glycol dimethyl ether, ethylene glycol diethyl ether, carbitol acetate, propylene glycol methyl ether acetate, propylene glycol ethyl ether acetate, dipropylene glycol methyl ether acetate, diethylene glycol ethyl ether acetate, methyl methoxypropionate, ethyl methoxypropionate, methyl ethoxypropionate, ethyl ethoxypropionate, ethyl acetate, n-butyl acetate, isoamyl acetate, ethyl lactate, acetone, methyl ethyl ketone, cyclohexanone, N,N-dimethylformamide, N,N-dimethylacetamide, N-methylpyrrolidone, γ-butyrolactone, dimethyl sulfoxide, chloroform, and methylene chloride.

Further, in the heat-curable resin composition of the present invention, any one of various conventionally known additives may be blended in. Examples thereof include inorganic fillers such as barium sulfate, talc, calcium carbonate, alumina, glass powder, ground quartz and silica, fiber reinforcements such as glass fibers, carbon fibers and boron nitride fibers, colorants such as titanium oxide, zinc oxide, carbon black, iron black, organic pigment and organic dye, antioxidants such as a hindered phenol-based compound, phosphorus-based compound and hindered amine-based compound and UV absorbers such as benzotriazole-based compound and benzophenone-based compound.

In addition, in the heat-curable resin composition, a viscosity modifier, a flame retardant, an antibacterial agent, an anti-fungus agent, an age inhibitor, an antistatic agent, a plasticizer, a lubricant, a foaming agent, or the like may be added and mixed in depending on the use.

EXAMPLES

Hereinafter, the present invention will be described in more detail by way of examples. However, the present invention is not limited to these examples.

Synthesis Example 1

Synthesis of Urethane Resin "PU-1"

2,400 g (=3 mol) of a polycarbonate diol derived from 1,5-pentanediol and 1,6-hexanediol (manufactured by Ube Industries, Ltd., PCDL800, number average molecular weight 800), 402 g (=3 mol) of dimethylolpropionic acid as a dihydroxyl compound having a carboxyl group, 1,554 g (=7 mol) of isophorone diisocyanate as a polyisocyanate and 238 g (=2.05 mol) of 2-hydroxyethylacrylate as monohydroxy compound were placed into a reaction vessel equipped with a stirrer, a temperature gauge, and a condenser. After the mixture was heated to 60° C. while being stirred, the heating was stopped. The mixture was heated again when the temperature inside the reaction vessel started to decrease, while stirring of the mixture was continued. After confirming disappearance of the isocyanate absorption band (2,280 $cm^{-1}$) in an infrared absorption spectrum, the reaction was terminated. Carbitol acetate was added in such a manner that the solid content would be 50 mass %, to thereby obtain a urethane resin PU-1 in the form of a viscous liquid containing a diluent. The resultant polyurethane had a number average molecular weight of 22,000 (the average molecular weight was a value in terms of polystyrene determined by means of gel carrier liquid chromatography (GPC-1 manufactured by GPC Showa Denko K. K.)) and a solid content acid value of 46 mgKOH/g.

Synthesis Example 2

Synthesis of Urethane Resin "PU-2"

A urethane resin PU-2 in the form of a viscous liquid containing a diluent was synthesized in the same manner as in Synthesis Example 1 except that 2,700 g of a polycarbonate diol derived from 1,6-hexanediol and 1,4-cyclohexanedimethanol (manufactured by Ube Industries, Ltd., UM-CARB90, number average molecular weight 900) was used as a polycarbonate diol. The resultant polyurethane had a number average molecular weight of 24,000 and a solid content acid value of 57 mgKOH/g.

Comparative Example 1

A styrene-acrylic resin manufactured by Johnson Polymer, JONCRYL 586 (having a molecular weight of 4,600 and a solid content acid value of 108 mgKOH/g) was used as a carboxyl group-containing resin.

Comparative Example 2

An acrylic copolymer resin manufactured by Daicel Chemical Industries, Ltd., Cyclomer P ACA320 (having a molecular weight of 20,000 and a solid content acid value of 130 mgKOH/g) was used as a carboxyl group-containing resin.

Examples 1 to 3 and Comparative Examples 1 to 2

The heat-curable resin compositions were respectively prepared by mixing (23° C.) the respective components at the compounding ratio shown in Table 1 by means of a three-roll mill. Each of the resultant heat-curable resin compositions was applied by means of a bar coater onto a substrate so as to have a film thickness of about 25 μm. Each of the substrates thus coated with the heat-curable resin composition was subjected to preheating at 80° C. for 15 minutes to preliminarily dry the solvent, and subsequently, subjected to heat curing at 150° C. for 60 minutes. Table 1 shows the results of the performance evaluation for the respective examples.
Performance Evaluation
(1) Warpage Property The heat-curable resin composition was applied onto a polyimide film (Kapton 100H; manufactured by DU PONT-TORAY CO., LTD., thickness 25 μm), followed by heat curing. After that, the resultant was cut by means of a circle cutter into a circle of 50 mmϕ. The circle cut piece had a portion deformed convexly or concavely in or around its center. 1 hour after the cutting, the circle cut piece was left standing in the state of convex downward, and the warpage degree was calculated by measuring and averaging the maximum and minimum warpage heights from the horizontal surface. With respect to the minus sign preceding a value in Table 1, when the circle cut piece was left standing in the state of convex downward, values in the cases where the cured film was above the polyimide film were shown as positive (plus), and the value in the case where the cured film was below the polyimide film was denoted by a minus sign "−".

(2) Flexibility

A sample after subjected to heat curing on a polyimide film (Kapton 100H; manufactured by DU PONT-TORAY CO., LTD., thickness 25 μm) was cut into a piece with 15×70 mm. The piece was bent by 180° in such a manner that the resist surface would be on the outer side, and a force of 0.35 kN was applied to the bent portion for 1 second. Flexibility was defined by the number of bendings until crack generation was observed with a microscope. The number of bending was at most 10 times, to perform evaluation.

(3) Soldering Heat Resistance

A part on a rigid copper substrate was masked with a Kapton polyimide tape (manufactured by DU PONT-TORAY CO., LTD.), and the masked surface and the non-masked surface were entirely coated to prepare a cured coating film. Then, the Kapton polyimide tape was peeled off, and rosin-based flux was applied, followed by immersion in a bath of solder at 260° C. for 10 seconds. The interface between the resist film and the tape-peeled portion was visually observed. The number of immersions enough to cause a change such as film peeling was evaluated. The number of immersion was at most 3 times, to perform evaluation.

(4) Adhesion

A copper substrate and a coating film cured on a polyimide film (Kapton 300H; manufactured by DU PONT-TORAY CO., LTD., thickness 100 μm) were used to evaluate adhesion in conformity with JIS K5600. A tape for peeling to be used was one manufactured by Nitto Denko Corporation.
○: The case where all the grids remained.
Δ: The case where 50 or more and less than 100 grids remained.
x: The case where less than 50 grids remained.

(5) Pressure Cooker Test (PCT: Test for Resistance to Moisture and Heat)

A cured coating film was formed on a flexible copper substrate (manufactured by Ube Industries, Ltd.: Upicel N SE3150), and the whole was left in a thermo-hygrostat having a constant temperature of 121° C. and a constant relative humidity of 100% RH for 120 hours. After that, the evaluation was performed according to the following criteria.
○: No swelling, no peeling and no color change was observed in the cured coating film.
Δ: Slight swelling, slight peeling and/or slight color change were observed in the cured coating film.
x: Significant swelling, peeling and color change was observed in the cured coating film.

(6) Resistance to Tin Plating

A cured coating film was formed on a flexible copper substrate (manufactured by Ube Industries, Ltd.: Upicel N SE3150), and the whole was immersed in a plating bath containing a tin plating solution (manufactured by Rohm & Haas: TINPOSIT LT-34) at 70° C. for 3 minutes. After that, the resultant was washed with hot water (at 70° C. for 3 minutes). The visual evaluation was performed according to the following criteria.
○: No swelling, no peeling and no color change was observed in the cured coating film.
Δ: Slight swelling, slight peeling and/or slight color change were observed in the cured coating film.
x: Significant swelling, peeling and color change was observed in the cured coating film.

TABLE 1

Compounding compositions (mass %) of, and property comparison among, curable compositions

|  | Synthesis Example | | | Comparative Example | |
| --- | --- | --- | --- | --- | --- |
|  | 1 | 2 | 3 | 1 | 2 |
| Urethane resin (A) | | | | | |
| PU-1 (Synthesis Example 1) | 85.0 | 85.0 | — | — | — |
| PU-2 (Synthesis Example 2) | — | — | 80.0 | — | — |
| JONCRYL 586 (Comparative Example 1) | — | — | — | 71.5 | — |
| Cyclomer P ACA320 (Comparative Example 2) | — | — | — | — | 66.0 |
| Heat-curable component (B) | | | | | |
| YL6121H (manufactured by JAPAN EPOXY RESINS | 14.0 | — | — | 26.5 | 32.0 |

TABLE 1-continued

Compounding compositions (mass %) of, and property comparison among, curable compositions

| | Synthesis Example | | | Comparative Example | |
|---|---|---|---|---|---|
| | 1 | 2 | 3 | 1 | 2 |
| CO., LTD.) | | | | | |
| Epikote 828 (manufactured by Japan Epoxy Resins Co., Ltd.) Bisphenol A-type liquid epoxy resin | — | 14.5 | 18.5 | — | — |
| Curing agent | | | | | |
| Melamine | 1.0 | 0.5 | 1.5 | 2.0 | 2.0 |
| Properties of cured film | | | | | |
| Warpage | −6 mm | 0 mm | 2 mm | 0 mm | 16 mm |
| Flexibility | 10 times or more | 10 times or more | 10 times or more | 0 | 0 |
| Soldering heat resistance | 3 times or more | 3 times or more | 3 times or more | Once | 3 times or more |
| Adhesion | ○ | ○ | ○ | ○ | ○ |
| PCT | ○ | Δ | ○ | X | ○ |
| Plating resistance (tin plating) | ○ | ○ | ○ | X | ○ |

Synthesis Example 3

Synthesis of Urethane Resin "PU-3"

1,800 g (=2 mol) of a polycarbonate diol derived from 1,6-hexanediol and 1,4-cyclohexanedimethanol (manufactured by Ube Industries, Ltd., UM-CARB 90, number average molecular weight 900, copolymerization ratio between the above two diols of 1:1 in mass ratio), 402 g (=3 mol) of dimethylolpropionic acid as a dihydroxyl compound having a carboxyl group, and 1,554 g (=7 mol) of isophorone diisocyanate as a polyisocyanate were placed into a reaction vessel equipped with a dropping funnel, a stirring device, a temperature gauge, and a condenser. After the mixture was heated to 60° C. while being stirred, the heating was stopped. The mixture was heated again after the temperature inside the reaction vessel started to decrease, and the mixture was stirred at 80° C. for 2 hours. 153 g (=2 mol) of glycolic acid as a monocarboxylic acid compound to serve as a terminal sealing agent was added by means of the dropping funnel, and the mixture was stirred at the temperature for an additional 2 hours. After confirming disappearance of the isocyanate absorption band (2,280 $cm^{-1}$) in an infrared absorption spectrum, the reaction was terminated. Carbitol acetate was added in such a manner that the solid content would be 50 mass %, to thereby synthesize a urethane resin PU-1 in the form of a viscous liquid containing a diluent. The resultant polyurethane had a number average molecular weight of 3,900 (the average molecular weight was a value in terms of polystyrene determined by means of gel carrier liquid chromatography (GPC-1 manufactured by GPC Showa Denko K. K.)) and a solid content acid value of 87 mgKOH/g.

Synthesis Example 4

Synthesis of Urethane Resin "PU-4"

A urethane resin PU-4 in the form of a viscous liquid containing a diluent was synthesized in the same manner as in Synthesis Example 3 except that 237 g (=2 mol) of hydroxypivalic acid was used as a monocarboxylic acid compound to serve as a terminal sealing agent. The resultant polyurethane had a number average molecular weight of 4,000 and a solid content acid value of 85 mgKOH/g.

Synthesis Example 5

Synthesis of Urethane Resin "PU-5"

A urethane resin PU-5 in the form of a viscous liquid containing a diluent was synthesized in the same manner as in Synthesis Example 3 except that 235 g (=2 mol) of 2-hydroxyethyl acrylate was used as a terminal sealing agent. The resultant polyurethane had a number average molecular weight of 4,000 and a solid content acid value of 57 mgKOH/g.

Synthesis Example 6

Synthesis of Urethane Resin "PU-6"

A urethane resin PU-6 in the form of a viscous liquid containing a diluent was synthesized in the same manner as in Synthesis Example 3 except that 148 g (=2 mol) of isobutanol was used as a monohydroxy compound to serve as a terminal sealing agent. The resultant polyurethane had a number average molecular weight of 4,000 and a solid content acid value of 58 mgKOH/g.

Examples 4 and 5 and Examples 6 and 7 for Comparison

Heat-curable resin compositions were respectively prepared by mixing (23° C.) the respective components at the compounding ratio shown in Table 2 by means of a three-roll mill. Each of the resultant heat-curable resin compositions was applied by means of a bar coater onto a substrate so as to have a film thickness of about 25 μm. Each of the substrates thus coated with the heat-curable resin composition was subjected to preheating at 80° C. for 15 minutes to preliminarily dry the solvent, and subsequently, subjected to heat curing at 150° C. for 60 minutes. Table 2 shows the results of the performance evaluation for the respective Examples together with those for the above Comparative Examples 1 and 2 measured in the same manner as above.

TABLE 2

Compounding compositions (mass %) of, and performance comparison among, curable compositions

| | Example | | | | Comparative Example | |
|---|---|---|---|---|---|---|
| | 4 | 5 | 6 | 7 | 1 | 2 |
| (A) Resin having carboxyl group | | | | | | |
| PU-3 (Synthesis Example 3): Urethane resin having carboxylic acids at both terminals (1) Terminal sealing agent: Glycolic acid | 76.0 | — | — | — | — | — |
| PU-4 (Synthesis Example 4): Urethane resin having carboxylic acids at both terminals (2) Terminal sealing agent: Hydroxypivalic acid | — | 75.0 | — | — | — | — |
| PU-5 (Synthesis Example 5): Urethane resin having unsaturated hydrocarbons at both terminals Terminal sealing agent: 2-hydroxyethyl acrylate | — | — | 80.0 | — | — | — |
| PU-6 (Synthesis Example 6): Urethane resin having unsaturated hydrocarbons at both terminals Terminal sealing agent: Isobutanol | — | — | — | 80.5 | — | — |
| JONCRYL 586 (Comparative Example 1) | — | — | — | — | 71.5 | — |
| Cyclomer P ACA320 (Comparative Example 2) | — | — | — | — | — | 66.0 |
| Heat-curable component (B) | | | | | | |
| Epikote 828 (manufactured by Japan Epoxy Resins co., Ltd.) Bisphenol A-type liquid epoxy resin | 22.5 | 23.0 | 18.5 | 18.0 | 26.5 | 32.0 |
| (B) curing agent | | | | | | |
| Melamine | 1.5 | 2.0 | 1.5 | 1.5 | 2.0 | 2.0 |
| Cured film performance | | | | | | |
| Warpage | 5 mm | 5 mm | −3 mm | 0 mm | 0 mm | 16 mm |
| Flexibility | 10 times or more | 10 times or more | 10 times or more | 10 times or more | 0 times | 0 times |
| Soldering heat resistance | 3 times or more | 3 times or more | Twice | 3 times or more | Once | 3 times or more |
| Adhesion | ○ | ○ | ○ | ○ | ○ | ○ |
| PCT | ○ | ○ | Δ | Δ | X | ○ |
| Plating resistance (tin plating) | ○ | ○ | X | X | X | ○ |

INDUSTRIAL APPLICABILITY

As described above, the heat-curable resin composition containing the polyurethane (A) and the heat-curable component (B) according to the present invention is excellent in adhesion with a substrate, low-warpage property, flexibility, resistance to moisture and heat, soldering heat resistance and resistance to tin plating. As a result, the heat-curable resin composition can be suitably used for applications in the fields of: a solder resist and an electrical insulating material such as an interlayer insulator; a sealing material for an IC or a very large scale integrated circuit (VLSI); a laminate sheet; and the like.

The invention claimed is:

1. A solder resist obtained by curing a heat-curable resin composition comprising (A) a polyurethane having two or more carboxyl groups in one molecule and (B) a heat-curable component which is an epoxy resin, wherein the polyurethane (A) is obtained by reaction using a polyol (d) having a carboxyl group in addition to a polymer polyol (b) and a polyisocyanate (c), further by a terminal sealing reaction by means of a monocarboxylic acid compound (a) having both a functional group reactive with an isocyanate group to cause an addition reaction or a condensation reaction and a carboxyl group in its molecule; or by a terminal sealing reaction by means of a monohydroxy compound selected from an aliphatic alcohol or a monohydroxymono(meth)acrylate compound, without containing residues of isocyanate group derived from the polyisocyanate (c), wherein the polymer polyol (b) is a polycarbonate diol that is not a polyester-based polyol, wherein the polycarbonate diol contains as structural units, repeating units derived from a linear aliphatic diol and an alicyclic diol, the number average molecular weight of the polycarbonate diol is from 400 to 2,000 and the copolymerization ratio between the linear aliphatic diol and the alicyclic diol is from 3:7 to 7:3 in mass ratio, wherein the polyisocyanate (c) is one or more diisocyanates selected from the group consisting of 2,4-toluene diisocyanate, 2,6-toluene diisocyanate, isophorone diisocyanate, hexamethylene diisocyanate, diphenylmethylene diisocyanate, (o, m, or p)-xylene diisocyanate, hydrogenated (o, m, or p)-xylene diisocyanate, methylenebis(cyclohexylisocyanate), trimethylhexamethylene diisocyanate, cyclohexane-1,3-dimethylene diisocyanate, cyclohexane-1,4-dimethylene diisocyanate and 1,5-naphthalene diisocyanate, and wherein the polyol (d) having a carboxyl group is a dihydroxy aliphatic carboxylic acid.

2. The solder resist according to claim 1, wherein the polyurethane (A) is a polyurethane which has one or more carboxyl groups at a molecular terminal.

3. The solder resist according to claim 1, wherein the polyurethane (A) has a number average molecular weight of 500 to 100,000 and an acid value of 5 to 150 mgKOH/g.

4. The solder resist according to claim 1, wherein the monocarboxylic acid compound (a) having both a functional group reactive with an isocyanate group to cause addition reaction or condensation reaction and a carboxyl group in its molecule is at least one selected from the group consisting of a monocarboxylic acid compound having a hydroxyl group, a monocarboxylic acid compound having an amino group and a monocarboxylic acid compound having a thiol group.

5. The solder resist according to claim 1, wherein the monocarboxylic acid compound (a) is a monohydroxycarboxylic acid.

6. The solder resist according to claim 1, wherein the epoxy resin is at least one selected from the group consisting of a bisphenol S-type epoxy resin, a diglycidyl phthalate resin, a heterocyclic epoxy resin, a bixylenol-type epoxy resin, a biphenyl-type epoxy resin, and a tetraglycidyl xylenoyl ethane resin.

7. The solder resist according to claim 1, wherein the ratio of the epoxy equivalent of the epoxy resin as the heat-curable component (B) to a carboxyl group equivalent of the polyurethane (A) having one or more carboxyl groups at a molecular terminal and having two or more carboxyl groups per one molecule is 1.0 to 3.0.

8. The solder resist according to claim 1, further comprising a curing agent.

9. The solder resist according to claim 8, wherein the curing agent is at least one selected from the group consisting of an amine, a quaternary ammonium salt, an acid anhydride, a polyamide, a nitrogen-containing heterocyclic compound and an organometallic compound.

10. The solder resist according to claim 1, further containing an organic solvent.

11. A printed wiring board having a surface partly or entirely coated with the solder resist according to claim 1.

* * * * *